United States Patent [19]

Chu et al.

[11] 4,385,975

[45] May 31, 1983

[54] METHOD OF FORMING WIDE, DEEP DIELECTRIC FILLED ISOLATION TRENCHES IN THE SURFACE OF A SILICON SEMICONDUCTOR SUBSTRATE

[75] Inventors: Shao-Fu Chu, Hopewell Junction, N.Y.; Allen P. Ho, Sunnyvale; Cheng T. Horng, San Jose, both of Calif.; Bernard M. Kemlage, Kingston, N.Y.

[73] Assignee: International Business Machines Corp., Armonk, N.Y.

[21] Appl. No.: 336,109

[22] Filed: Dec. 30, 1981

[51] Int. Cl.$^3$ ............................................. C23C 15/00
[52] U.S. Cl. .............................. 204/192 E; 156/643; 156/652; 156/653; 156/657
[58] Field of Search ..................... 204/192 E; 156/643, 156/653, 657, 652

[56] References Cited

U.S. PATENT DOCUMENTS

| | | | |
|---|---|---|---|
| 3,976,524 | 8/1976 | Feng | 156/8 |
| 4,073,054 | 2/1978 | Kaji et al. | 204/192 E |
| 4,092,210 | 5/1978 | Hoepfner | 204/192 E |
| 4,139,442 | 2/1979 | Bondur et al. | 204/192 |
| 4,211,582 | 7/1980 | Horng et al. | 148/1.5 |
| 4,222,792 | 9/1980 | Lever et al. | 148/1.5 |
| 4,234,362 | 11/1980 | Riseman | 204/192 E |
| 4,307,179 | 12/1981 | Chang et al. | 204/192 E |
| 4,309,812 | 1/1982 | Horng et al. | 204/192 E |
| 4,318,751 | 3/1982 | Horng | 204/192 E |
| 4,338,138 | 6/1982 | Caualiere | 204/192 E |

OTHER PUBLICATIONS

T. A. Bartush et al., "Dielectric Isolation Planarization", IBM Technical Disclosure Bulletin, vol. 21, No. 5, Oct. 1978, pp. 1868–1869.

*Primary Examiner*—Arthur P. Demers
*Attorney, Agent, or Firm*—Mitchell S. Bigel

[57] ABSTRACT

A method of forming a wide deep dielectric filled isolation trench in the surface of a silicon semiconductor substrate by forming a wide plug of chemical vapor deposited silicon dioxide in the trench, filling the remaining unfilled trench portions by chemical vapor depositing a layer of silicon dioxide over the substrate and etching back this layer. The method produces chemically pure, planar wide deep dielectric filled isolation trenches and may also be used to simultaneously produce narrow deep dielectric filled isolation trenches.

17 Claims, 5 Drawing Figures

METHOD OF FORMING WIDE, DEEP DIELECTRIC FILLED ISOLATION TRENCHES IN THE SURFACE OF A SILICON SEMICONDUCTOR SUBSTRATE

DESCRIPTION

1. Technical Field

This invention generally relates to a method of manufacturing semiconductor devices and more particularly to a method of forming wide deep dielectric filled isolation trenches in the surface of a silicon semiconductor substrate.

As is well known to those having skill in the semiconductor art, large scale integrated circuit chips require a large number of surface conductors for the distribution of operating voltages/currents and digital signals from device to device. Although these surface conductors are insulated from the semiconductor substrate upon which they lie, a certain amount of capacitive coupling is present between the insulated conductors and the substrate through the intervening insulating material. This capacitive coupling degrades the signals carried by the surface conductors.

Capacitive coupling between the surface conductors and the substrate can be minimized by increasing the thickness of the dielectric material separating the conductors from the substrate. In order to maintain the planarity of the surface conductors it is desirable to recess the dielectric material below the surface of the substrate rather than adding the dielectric material above the surface of the substrate. It is therefore highly desirable to have the plurality of surface conductors lie on a wide deep dielectric filled isolation trench in the surface of the silicon semiconductor substrate.

2. Background Art

Methods of forming narrow deep dielectric filled isolation trenches in a semiconductor substrate are well known in the art. In one method disclosed in U.S. Pat. No. 4,139,442 to Bondur et al, assigned to the assignee of the present invention, narrow deep recessed oxide regions are formed in a silicon substrate by reactive ion etching narrow trenches in the silicon substrate and thermally oxidizing the trench walls to completely fill in the narrow trenches. In another method disclosed in IBM Technical Disclosure Bulletin, Vol. 21, No. 5, p. 1868 to Bartush et al, narrow deep recessed oxide regions are produced by chemical vapor depositing a layer of silicon dioxide over a silicon substrate having a narrow trench, and then uniformly etching back to the surface of the silicon substrate, leaving the silicon dioxide filled narrow trench.

Neither of the above methods for forming narrow deep dielectric filled trenches may be used to form wide deep dielectric filled trenches. The Bondur et al method may not be used, as a layer of thermal oxide thick enough to fill in a wide trench cannot be grown without excessive heat cycle time. The Bartush et al method may not be used, as a chemical vapor deposited silicon dioxide layer does not planarize across a wide trench as it does across a narrow trench. Thus, when deposited, the silicon dioxide will be the same thickness at the bottom of the wide trench as it is on the semiconductor surface. The silicon dioxide in the wide trench will then be etched away when the silicon dioxide on the surface is etched, leaving a partially filled wide trench.

Various methods have been proposed for forming wide deep dielectric isolation trenches all of which have various shortcomings as described below. One general way the prior art has sought to form wide deep dielectric filled isolation trenches is by forming a plurality of closely spaced narrow trenches and then converting them into a single wide trench. For example, in FIG. 2 of the above cited Bondur et al patent, a wide deep dielectric filled isolation trench is formed by reactive ion etching a plurality of closely spaced narrow trenches in the surface of a semiconductor substrate and thermally oxidizing the trench walls to completely fill in the trenches with oxide and convert the silicon between the trenches to silicon dioxide. In FIG. 3 of the above cited Bondur et al patent a plurality of closely spaced narrow trenches are formed and then thermally oxidized to partially fill in the trenches. The filling of the trenches is then completed by deposition of suitable material such as pyrolitically deposited silicon oxide.

Unfortunately, the Bondur et al methods of forming a wide deep dielectric filled isolation trench by forming a plurality of closely spaced narrow trenches requires the use of state of the art electron beam lithography techniques for defining the plurality of closely spaced narrow trenches. U.S. Pat. No. 4,211,582 to Horng et al, assigned to the assignee of the present invention, attempts to reduce the required lithography precision by producing closely spaced narrow shallow trenches and reactive ion etching to convert the shallow trenches to a succession of narrow deep trenches. Again, however, the tolerances required for masking are state of the art, while the number of processing steps is increased. In addition, the thermal oxidation thickness required may produce a significant number of crystallographic defects within the silicon substrate.

Another general way the prior art has sought to form a wide deep dielectric filled isolation trench involves forming a wide trench in the substrate surface and forming a wide organic material plug in the trench leaving only a narrow unfilled area to be subsequently filled by a second layer of organic material. For example, the above cited IBM Technical Disclosure Bulletin to Bartush et al discloses forming a wide resist plug over a silicon dioxide layer in the wide trench and forming a second resist layer over the plug. The resist and silicon dioxide layers layers are then reactive ion etched down to the top of the substrate at an etch rate ratio of 1:1 to planarize the trench. Unfortunately, when a resist layer is heated during a resist reflow or reactive ion etch step the resist tends to form waves or ripples on the surface thereof. The resist will then etch in a rippled manner, producing a wide dielectric isolation trench having a rippled surface, unsuitable for carrying a plurality of surface conductors.

A second example of a prior art method for forming a deep wide dielectric filled isolation trench by means of a wide organic material plug is disclosed in U.S. Pat. No. 4,222,792 to Lever et al, assigned to the assignee of the present invention. In Lever et al, a wide trench is formed in the surface of a silicon substrate and a layer of organic resin glass in a solvent is spin coated over the surface of the semiconductor substrate and within the trench. The resin glass within the trench is exposed to an electron beam to render the resin glass within the trench impervious to a developing solvent. The remainder of the resin glass is stripped away by developing in a solvent, and the resin glass plug within the trench is converted to silicon dioxide by heating in an oxygen ambient. Finally, a layer of silicon dioxide is deposited over the entire surface of the semiconductor substrate and etched away to planarize the trench.

The Lever et al method involves two primary disadvantages. First, the resin glass used to form the resin glass plug is impure, and adds contaminants to the semiconductor substrate through diffusion and migration. In order to prevent these contaminants from affecting semiconductor device operation, a contaminant barrier layer, e.g., chemical vapor deposited silicon nitride, must be added prior to trench filling and then removed from the surface of the substrate after trench filling, thus complicating the process. Moreover, it is difficult to properly form both wide and narrow dielectric filled trenches with the Lever et al method, because the liquid resin glass will remain planar over the narrow trench but follow the contours of the wide trench. Thus the resin glass will be much thicker over the narrow trench than it is over the wide trench. When the resin glass in the narrow and wide trenches are electron beam exposed, and the unexposed resin glass is stripped away, a mound of resin glass will remain over the narrow trench, above the surface of the semiconductor substrate. This mound of resin glass must be removed to planarize the narrow trench.

In conclusion, the prior art has heretofore not provided a wholly acceptable method of forming a wide deep dielectric filled isolation trench in the surface of a silicon semiconductor substrate. Such a method is provided by the present invention.

DISCLOSURE OF THE INVENTION

It is a primary object of this invention to provide an improved method of forming a wide deep dielectric filled isolation trench in the surface of a silicon semiconductor substrate.

It is another object of the invention to provide the above trench without using state of the art fine line electron beam lithography techniques.

It is a further object of the invention to provide the above trench using dielectric materials which will not form ripples on the surface of the filled trench.

It is a further object of the invention to provide the above trench without using materials which contain contaminants and necessitate using a contaminant barrier.

It is a further object of the invention to provide the above trench using processes and materials which are capable of forming both wide and narrow dielectric filled isolation trenches.

These and other objects are accomplished by forming a wide deep trench in the surface of a silicon substrate using etching or other well known techniques. A first layer of silicon dioxide ($SiO_2$) is chemical vapor deposited (CVD) on the surface of the silicon substrate including the trench. A wide oxide plug is formed in the wide trench by masking at least a portion of the CVD $SiO_2$ surface within the trench and reactive ion etching the CVD $SiO_2$ down to the silicon substrate, leaving a narrow unfilled portion at each end of the trench. The unfilled portions are filled by depositing a second layer of CVD $SiO_2$ and then etching back this layer.

Since the process of the present invention employs a CVD $SiO_2$ plug rather than a photoresist plug, the formation of ripples on the surface of the plug during subsequent high temperature processing steps is precluded. Thus, the wide deep dielectric filled trenches formed by the method of present invention will be planar and not rippled. Moreover, since glass resin is not employed, contamination of the silicon substrate is eliminated. The method of the present invention will also simultaneously fill narrow dielectric isolation trenches, without additional processing steps.

BEST MODE FOR CARRYING OUT THE INVENTION

Figure 1:
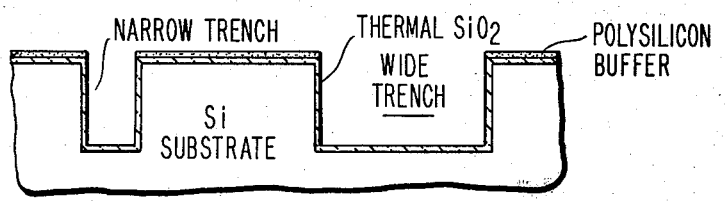
FIGS. 1–5 are cross sectional views of a portion of a semiconductor substrate at successive stages of practicing the method of the present invention.

Referring now to FIG. 1, there is illustrated a silicon semiconductor substrate in which a number of solid state devices such as transistors, diodes or FETs (not shown) may be fabricated. A narrow trench and a wide trench are shown in the surface of the silicon substrate. Both trenches are approximately 4 $\mu$m deep. In the semiconductor manufacturing art, trenches wider than about 15 $\mu$m are referred to as wide, although more typically narrow trenches are about 2 $\mu$m wide while wide trenches are about 50 $\mu$m wide. The wide and narrow trenches may be formed by reactive ion etching through a suitable mask. The reactive ion etching may be done, for example, in a plasma containing a mixture of $SF_6+Cl_2+He$. Other techniques for forming wide and narrow trenches are well known to those having skill in the art.

A thin (approximately 8500 Å) layer of polysilicon over a thin (approximately 1000 Å) layer of thermal $SiO_2$ may be grown on the surface of the silicon substrate prior to trench etching to act as an etch stop. After trench etching, a thin (approximately 1000 Å) layer of thermal $SiO_2$ may be grown on the walls and floors of the trenches to insure a good quality $SiO_2$/Si interface. The thermal oxide may be grown, for example, by heating the substrate in an $O_2$ atmosphere. In FIG. 1, a continuous layer of thermal $SiO_2$ (formed on the silicon substrate prior to trench etching and within the trench after trench etching) and a polysilicon layer, are both shown.

Figure 2:
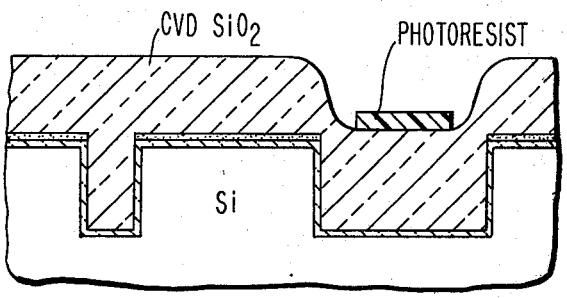

Referring now to FIG. 2, a CVD $SiO_2$ layer is formed over the surface of the substrate including in the wide and narrow trenches. The $SiO_2$ layer may be formed using the well known CVD process in Silane + $N_2O$ at 800° C. The thickness of the CVD $SiO_2$ layer is approximately equal to the total depth of the wide trench so that the top of the CVD $SiO_2$ layer in the trench is approximately even with the top layer on the silicon substrate. Thus, if the optional thermal $SiO_2$ and polysilicon layers are added to the substrate prior to trench etching, the top of the CVD $SiO_2$ layer in the wide trench should be approximately even with the top of the polysilicon layer.

As will be seen from an examination of FIG. 2, the CVD $SiO_2$ layer planarizes over the narrow trench but does not planarize over the wide trench. Thus, with regard to the narrow trench, the CVD $SiO_2$ may be etched back down to the substrate surface to provide a planar $SiO_2$ filled narrow trench. With regard to the wide trench, the CVD $SiO_2$ roughly follows the contour of the wide trench so that the thickness of the CVD $SiO_2$ in the trench is the same as the thickness of the CVD $SiO_2$ outside the trench. If the wide trench is etched back down to the substrate surface, most of the CVD $SiO_2$ within the wide trench will also be etched away, leaving the trench unfilled.

According to the present invention the wide trench may be filled by forming a wide $SiO_2$ plug from the CVD $SiO_2$ layer within the trench, as shown in FIG. 2. Formation of a wide CVD $SiO_2$ plug within the trench is accomplished by applying a photoresist over at least a portion of the flat area of the CVD $SiO_2$ within the wide dielectric trench. In the preferred embodiment, the photoresist is formed over the entire width of the flat CVD $SiO_2$ region within the wide trench, so as to achieve as wide an $SiO_2$ plug as possible. The CVD $SiO_2$ layer is then reactive ion etched (RIE) in an environment of $CF_4+H_2$. In such an environment, the etch rate ratio (E.R.R.) of $SiO_2$:photoresist is approximately 8:1 and the E.R.R. of $SiO_2$:Si is approximately 10:1. Moreover, the RIE process effectively etches only in the vertical direction. The CVD $SiO_2$ layer of FIG. 2 is reactive ion etched down to the polysilicon buffer and the photoresist removed, resulting in the structure of FIG. 3.

Figure 3:
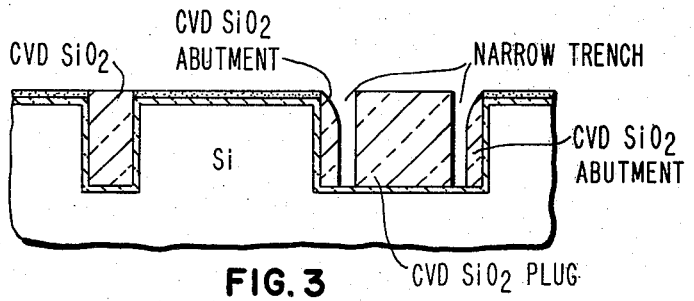

Referring now to FIG. 3, it will be seen that the narrow trench has been filled with CVD $SiO_2$ and has been planarized. The masked CVD $SiO_2$ has formed a wide CVD $SiO_2$ plug in the wide trench leaving a narrow unfilled trench at either end of the wide $SiO_2$ plug. The RIE process also produces a pair of CVD $SiO_2$ abuttments on the wide trench sidewalls further reducing the size of the narrow unfilled trenches. The narrow trenches may then be filled by CVD depositing a second $SiO_2$ layer as shown in FIG. 4.

Figure 4:
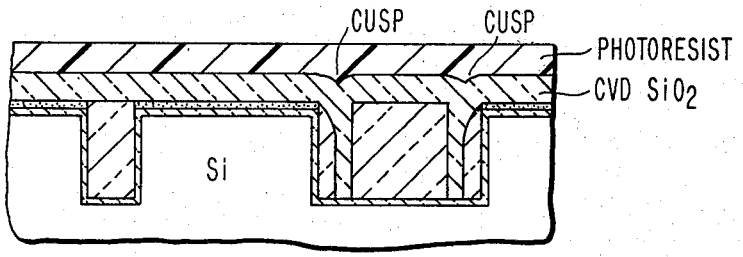

Referring now to FIG. 4, a second CVD $SiO_2$ layer (approximately 2 82 m thick) is deposited over the semiconductor substrate including the trench areas. As will be seen from FIG. 4, the surface of the second CVD $SiO_2$ layer is substantially planar with the possible exception of a pair of cusps formed over the narrow unfilled trenches. The second CVD $SiO_2$ layer is reactive ion etched down to the polysilicon buffer. Alternatively, a layer of photoresist (shown in FIG. 4) may be spun on the second CVD $SiO_2$ layer, and the photoresist and second CVD $SiO_2$ layer reactive ion etched in an ambient of $CF_4$ wherein the E.R.R. of Si:$SiO_2$:photoresist is about 1:1:1. Alternatively, the photoresist and second CVD $SiO_2$ layer may be reactive ion etched in an ambient of $H_2$ or an ambient of $CF_4+H_2$. The etch is stopped at the polysilicon buffer. The polysilicon buffer and thermal $SiO_2$ layer may then be chemically etched from the substrate surface, resulting in the structure of FIG. 5.

Figure 5:
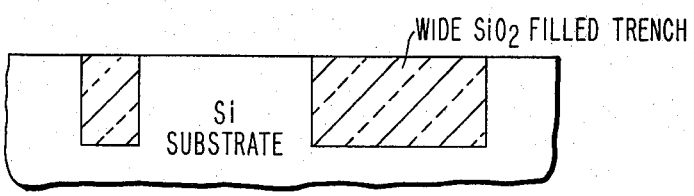

Referring now to FIG. 5, the wide $SiO_2$ filled trench is illustrated as a unitary structure, since it is entirely composed of $SiO_2$. However, from the above description of FIGS. 1-4, it will be recognized that the $SiO_2$ within the wide trench came from three sources, i.e., the thin thermal layer of FIG. 1, the first CVD $SiO_2$ layer of FIG. 2 and the second CVD $SiO_2$ layer of FIG. 4.

It will be recognized by those having skill in the art that the above described process used a wide CVD $SiO_2$ plug to planarize a wide trench. By using CVD $SiO_2$, the introduction of impurities into the semiconductor substrate is avoided. Such impurities were present when a glass resin plug was used. Moreover, the CVD $SiO_2$ plug did not ripple during reactive ion etching, as would a photoresist plug. Finally, the first CVD $SiO_2$ layer effectively filled any narrow trenches on the semiconductor substrate while forming a wide $SiO_2$ plug in the wide trench. It will also be recognized by those having skill in the art that suitable dielectrics other than $SiO_2$, e.g., Phosphorous Silicate Glass, may be used in practicing the above described process.

Whereas we have illustrated and described the preferred embodiment of the invention, it is to be understood that we do not limit ourselves to the precise construction herein disclosed and the right is reserved to all changes and modifications coming within the scope of the invention as defined by the appended claims.

We claim:

1. A method of forming a wide deep dielectric filled isolation trench in the surface of a silicon semiconductor substrate comprising the steps of:
    forming a wide deep trench in the surface of the silicon substrate,
    forming a dielectric plug in said trench by chemical vapor depositing a first layer of dielectric material on the surface of the silicon substrate including said trench, masking at least a portion of said first layer in said trench, and etching said first layer down to the top of said trench,
    chemical vapor depositing a second layer of dielectric material on the surface of the silicon substrate including said trench, and
    etching said second layer down to the top of said trench.

2. The method of claim 1 wherein said first layer is etched down to the top of said trench by reactive ion etching in an ambient of $CF_4$ and $H_2$.

3. The method of claim 1 wherein the width of the dielectric plug formed in said trench is slightly less than the width of said trench.

4. A method of forming a wide deep dielectric filled isolation trench in the surface of a silicon semiconductor substrate comprising the steps of:
    forming a wide deep trench in the surface of the silicon substrate,
    chemical vapor depositing a first layer of dielectric material on the surface of the silicon substrate including said trench,
    removing said first layer of dielectric material from the surface of the silicon substrate and from a narrow portion of said trench using lithography and etching techniques,
    chemical vapor depositing a second layer of dielectric material on the surface of the silicon substrate including said trench, and
    etching said second layer down to the top of said trench.

5. The method of claim 4 wherein said first layer is removed by reactive ion etching in an ambient of $CF_4$ and $H_2$.

6. A method of forming a wide deep dielectric filled isolation trench in the surface of a silicon semiconductor substrate comprising the steps of:
    forming a wide deep trench in the surface of the silicon substrate,
    chemical vapor depositing a first layer of silicon dioxide on the surface of the silicon substrate including said trench, the thickness of said first layer in said trench being equal to the depth of said trench,
    masking at least a portion of said first layer in said trench,
    reactive ion etching said first layer down to the top of said trench,
    chemical vapor depositing a second layer of silicon dioxide on the surface of the silicon substrate including said trench, and etching said second layer down to the top of said trench.

7. The method of claim 6 wherein said first layer is reactive ion etched down to the top of said trench in an ambient of $CF_4$ and $H_2$.

8. The method of claim 6 wherein the chemical vapor deposited first layer of silicon dioxide has a flat surface within said trench and wherein the entire flat surface of said first layer in said trench is masked.

9. The method of claims 1, 4 or 6 wherein the step of forming a wide deep trench is carried out by reactive ion etching, through a suitable mask, in a plasma containing a mixture of $SF_6$, $Cl_2$ and He.

10. The method of claims 1, 4 or 6 wherein said first layer and said second layer are chemical vapor deposited at 800° C. in an ambient of Silane and $N_2O$.

11. The method of claim 1, 4 or 6 wherein said second layer is etched down to the top of said trench by reactive ion etching in an ambient of $CF_4$ and $H_2$.

12. The method of claim 1, 4 or 6 wherein said second layer is etched down to the top of said trench by reactive ion etching in an ambient of $CF_4$.

13. The method of claims 1, 4 or 6 wherein the step of forming a wide deep trench in the surface of the silicon substrate is followed by the steps of thermally growing a thin layer of silicon dioxide on the walls and floor of said trench.

14. The method of claims 1, 4 or 6 wherein the second chemical vapor depositing step is followed by the step of depositing a layer of photoresist on said second layer and wherein the final etching step includes etching the layer of photoresist and said second layer down to the top of said trench.

15. The method of claims 1, 4 or 6 wherein the first layer of dielectric material deposited on the surface of the silicon substrate including said trench is of the same thickness in said trench as on the surface of the silicon substrate, the thickness being equal to the depth of said trench.

16. A method of forming a narrow and a wide dielectric filled isolation trench in the surface of a silicon semiconductor substrate comprising the steps of:

forming a narrow and a wide trench in the surface of the silicon substrate, chemical vapor depositing a first layer of silicon dioxide on the surface of the silicon substrate including said narrow and said wide trenches, the thickness of said first layer in said wide trench being equal to the depth of said wide trench, masking at least a portion of said first layer in said wide trench, reactive ion etching said first layer down to the top of said wide trench, chemical vapor depositing a second layer of silicon dioxide on the surface of the silicon substrate including said wide and said narrow trench, and reactive ion etching said layer down to the top of said wide trench.

17. The method of claim 16 wherein the surface of said first layer is planar across said narrow trench and is nonplanar across said wide trench.

* * * * *